July 6, 1965 B. BOLLEE ETAL 3,193,780

TUNNEL DIODE CRYSTAL OSCILLATOR

Filed Oct. 31, 1962

INVENTORS
BOUDEWIJN BOLLEE &
DIRK VAN AS
BY
AGENT

United States Patent Office 3,193,780

Patented July 6, 1965

3,193,780
TUNNEL DIODE CRYSTAL OSCILLATOR

Boudewijn Bollee and Dirk van As, Emmasingel, Eindhoven, Netherlands, assignors to North American Philips Company, Inc., New York, N.Y., a corporation of Delaware Filed Oct. 31, 1962, Ser. No. 234,362
Claims priority, application Netherlands, Nov. 10, 1961, 271,284
3 Claims. (Cl. 331—107)

This invention relates to devices for producing electrical oscillations, more particularly sinusoidal oscillations, by means of a tunnel diode which is coupled to a piezo-electric crystal, for example a quartz crystal.

It is known per se to produce electrical oscillations by means of a tunnel diode, the frequency of the oscillations produced being influenced by a quartz crystal coupled to the tunnel diode. A known circuit (Journal of the British I.R.E., August 1960, pages 621 to 623) utilizes one or two tunnel diodes, one of which serves to produce the oscillations, in this case relaxation oscillations. The tunnel diode, which is connected as an oscillator, is coupled to a quartz crystal by means of a transformer. To permit the frequency of the oscillator to be influenced by the quartz crystal, the transformer must be so proportioned that sufficient coupling between the diode and the crystal is established. However, the possibilities of application of a tunnel diode oscillator with a crystal thus coupled to it are limited by two disadvantages. A first disadvantage of this circuit is that the stray inductance of the transformer in series with the tunnel diode is so great that the circuit also oscillates when the quartz crystal is removed. In fact, it is frequently desirable to remove and replace the crystal by one having a nominal frequency which considerably differs from that of the first crystal. Parasitic oscillations during switching over are then troublesome. A second disadvantage of the known circuit is that the proportioning of the circuit elements must be varied if the quartz crystal is replaced by another having a nominal frequency which differs from that of the first crystal.

An object of the invention is to obviate these disadvantages and it is characterized in that the crystal and the tunnel diode are coupled directly for the frequency of the oscillations to be produced, each electrode of the tunnel diode being connected through an impedance which is negligible relative to the oscillations to be produced to a terminal of the crystal, and the circuit elements associated with the crystal and the tunnel diode being so proportioned that oscillations do not occur if the crystal is removed and the circuit starts oscillating by including the crystal in the circuit.

In order that the invention may be readily carried into effect, it will now be described in detail, by way of example, with reference to the accompanying drawing, in which.

Figure 1:
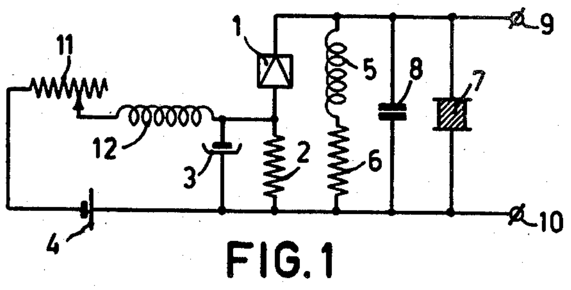
FIGURE 1 shows a diagram of a circuit according to the invention.

In FIGURE 1, a tunnel diode 1 is powered from a voltage source 4 through a variable resistor 11 and a resistor 2 which is shunted by a large capacitor 3. One electrode of tunnel diode 1 is connected directly to one terminal of a quartz crystal 7. The other electrode of tunnel diode 1 is connected through the parallel combination of resistor 2 and the large capacitor 3 to the other terminal of the quartz crystal, the parallel combination 2, 3 constituting a negligible impedance for the oscillations to be produced. According to the invention, each electrode is thus connected to a terminal of the quartz crystal through an impedance which is negligible for the oscillations to be produced. The oscillations produced are derived from terminals 9 and 10.

In order that the tunnel diode 1 may be traversed by direct current and thus adjusted to its work-point, and because the quartz crystal 7 does not pass direct current, the crystal 7 is shunted by a series-combination of a coil and a resistor, which series-combination may be represented by an inductor 5 and a resistor 6. The loss resistance of the coil is included in the resistor 6.

Since the impedance of the series-combination of the coil and the resistor must not or substantially not constitute a short-circuit for the alternating voltage set up between the terminals 9 and 10 or by the oscillator, the inductor 5 and/or the resistor 6 will be given a maximum value. However, the value of resistor 6 is limited since for obtaining a stable adjustment of the direct voltage of the tunnel diode, it is necessary to fulfill the condition that the total resistance of the external circuit connected to the diode must be lower than the absolute value of the differential resistance in the steepest portion of the static current-voltage characteristic of the diode, in order to ensure that only one point of intersection of the resistance line and the current-voltage characteristic is possible.

The value of the coil is also limited in order that the tunnel diode 1 does not oscillate in a parasitic manner in the absence of the quartz crystal 7. It is therefore necessary to fulfill the condition:

$$L<R|R_-|C \qquad (1)$$

wherein L is the total series-inductance of the diode and the circuit connected thereto, R is the series-resistance of the internal loss resistance of the diode and the resistance of the circuit connected thereto $R_-$ is the absolute value of the negative resistance of the tunnel diode at the work-point, and C is the capacitance of the tunnel diode.

According to a characteristic of the invention, an additional capacitor 8 is connected parallel to the crystal 7. The magnitude C in the above-mentioned inequality (1) thus increases so that the inequality is also retained for a value of L which is not unduly small.

The circuit, which does not oscillate in the absence of the crystal 7, produces sinusoidal oscillations if the crystal 7 is present. The frequency of the oscillations produced is determined by the natural frequency of the relevant crystal and may vary by several octaves merely by changing the crystal.

The surprising effect that a non-oscillating circuit may start oscillating by the addition of a passive element (in this case the crystal 7) may, in accordance with a recognition underlying the invention, be explained as follows:

The necessary condition for oscillating is:

$$L>R|R_-|C \qquad (2)$$

The inequality (1) must therefore change to (2) by adding the crystal to the circuit. Such is the case indeed if the quality of the crystal 7 is so high as compared with the quality of the series-circuit 5, 6 that L decreases, it is true, but the ratio $L/R$ increases.

The voltage source 4 provides a voltage drop across the resistor 2, and this voltage drop is applied between the electrodes of the diode in order to bias the diode to a working point in the negative resistance region of its characteristics. In operation, when the crystal is present, the inequality (2) is satisfied, so the circuit oscillates at a frequency determined by the crystal. When the crystal is removed, the circuit inductance increases, but the ratio $L/R$ decreases due to the removal of the high Q crystal, so that the inequality (1) is satisfied and the circuit ceases to oscillate. The inductance 6 thus must have a value such that the inequality (2) is satisfied when the crystal is present, and the inequality (1) is satisfied when the crystal is absent.

Figure 2:
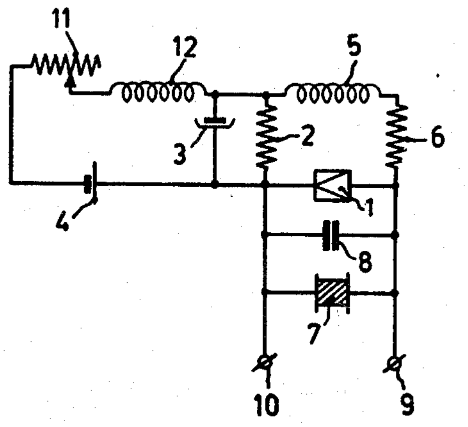
FIGURE 2 shows a variant thereof.

In the circuit shown in FIGURE 2, the terminals of the crystal 7 are connected directly to the electrodes of the tunnel diode 1. The operation of the circuit shown in FIGURE 2 is similar to that of the circuit shown in FIGURE 1.

In one embodiment of the circuit shown in FIGURE 1, the tunnel diode 1 was of the experimental type; the diode current was 0.37 ma. at a diode voltage of 0.1 volt; the differential resistance $R_{-}$ at the work-point was about −200 ohms; the voltage source 4 was 1.5 volts; the resistors 2, 6 and 11 were 82 ohms, 56 ohms and at most 1000 ohms respectively; the capacitor 3 was 1 $\mu$f.; the inductor 5 was 4 $\mu$h. and the capacitor 8 was 390 pfs.

The frequency of the sinusoidal oscillations produced varied from 1.9 mc./s. to 12 mc./s. if the crystal was replaced by another crystal of suitable type.

The circuit shown in FIGURE 1 permits of producing free-running relaxation oscillations in the absence of the crystal 7 and the capacitor 8 if the circuit elements are suitably chosen. This is known per se. Said relaxation oscillations may be synchronized by including the quartz crystal 7 in the circuit.

In an embodiment of the circuit of FIGURE 1 in which synchronized relaxation oscillations are produced, the inductor 5 was 560 $\mu$h., resistor 2 was 82 ohms, capacitor 3 was 1 $\mu$f. the nominal frequency of the crystal was 3,000 kc./s. If the resistor 6 varied between 10 ohms and 300 ohms, the frequency of the synchronized relaxation oscillations varied from 300 kc./s. to 200 kc./s. and hence the frequency division varied from 10 to 15.

What is claimed is:

1. A circuit for generating electric oscillations comprising a tunnel diode, a piezo-electric crystal, a parallel circuit of a capacitor and resistor, said parallel circuit having a negligible impedance for said oscillations, a coil, means connecting said diode, parallel circuit and coil in a closed loop circuit, a source of bias voltage for said diode connected to said resistor, and means connecting said crystal between two points on said loop circuit whereby any impedance between the electrodes of said diode and said crystal is negligible at the frequency of said oscillations, said coil having an inductance determined by the expression:

$$L<R_1R_2C$$

wherein L is the total series inductance of said diode and the circuit connected thereto, $R_1$ is the series resistance of the internal loss resistance of said diode and the resistance of the circuit connected thereto, $R_2$ is the absolute value of the negative resistance of said tunnel diode at the work-point, and C is the total capacitance of said tunnel diode and capacitance in parallel therewith, when said crystal is omitted, and:

$$L>R_1R_2C$$

when said crystal is connected.

2. The circuit of claim 1, wherein said crystal is connected in parallel with said diode.

3. The circuit of claim 1, wherein said crystal is connected in parallel with the series combination of said diode and parallel circuit.

References Cited by the Examiner

UNITED STATES PATENTS

| | | | |
|---|---|---|---|
| 3,041,552 | 6/62 | Adamthwaite et al. | 331—107 |
| 3,054,070 | 9/62 | Rutz | 307—88.5 |
| 3,081,436 | 3/63 | Watters | 331—107 |

OTHER REFERENCES

Article in CQ, February 1961, page 112.

ROY LAKE, *Primary Examiner.*

JOHN KOMINSKI, *Examiner.*